United States Patent
Ciliox et al.

(10) Patent No.: US 8,691,624 B2
(45) Date of Patent: Apr. 8, 2014

(54) DIE FIXING METHOD AND APPARATUS

(75) Inventors: Alexander Ciliox, Möhnesee (DE); Georg Borghoff, Warstein (DE); Torsten Groening, Paderborn (DE); Karsten Guth, Soest (DE)

(73) Assignee: Infineon Technologies AG, Neubiberg (DE)

( * ) Notice: Subject to any disclaimer, the term of this patent is extended or adjusted under 35 U.S.C. 154(b) by 52 days.

(21) Appl. No.: 13/305,135

(22) Filed: Nov. 28, 2011

(65) Prior Publication Data

US 2013/0137215 A1    May 30, 2013

(51) Int. Cl.
*H01L 21/50* (2006.01)
*B32B 37/00* (2006.01)

(52) U.S. Cl.
USPC ............ 438/107; 257/E21.499; 257/E21.511; 438/106; 438/108

(58) Field of Classification Search
USPC ........... 257/E21.499, E21.511; 438/106, 107, 438/108
See application file for complete search history.

(56) References Cited

U.S. PATENT DOCUMENTS

| | | | | |
|---|---|---|---|---|
| 5,572,405 A | * | 11/1996 | Wilson et al. | 361/705 |
| 5,841,194 A | * | 11/1998 | Tsukamoto | 257/729 |
| 6,284,569 B1 | * | 9/2001 | Sheppard et al. | 438/110 |
| 2006/0223239 A1 | * | 10/2006 | Khaw et al. | 438/127 |

* cited by examiner

*Primary Examiner* — Peniel M Gumedzoe
(74) *Attorney, Agent, or Firm* — Murphy, Bilak & Homiller, PLLC

(57) ABSTRACT

A die fixing method is disclosed which includes providing a substrate having a metallized surface, forming a joining material on the metallized surface and placing a die alignment member with a plurality of openings on the substrate so that portions of the joining material are exposed through the openings. The method further includes placing a plurality of dies in the openings of the die alignment member with a bottom side of each die in contact with part of the joining material and attaching the plurality of dies to the metallized surface of the substrate at an elevated temperature and pressure, the die alignment member withstanding the elevated temperature and pressure. The die alignment member is removed from the substrate after the plurality of dies are attached to the metallized surface of the substrate.

13 Claims, 5 Drawing Sheets

DIE FIXING METHOD AND APPARATUS

TECHNICAL FIELD

The present application relates to semiconductor die, in particular fixing semiconductor die to a substrate.

BACKGROUND

Die (chip) fixation processes typically use a tape having sufficient adhesion capability for fixing the die during transport and sinter processes. The dies are mounted on top in this configuration. The substrate to which the dies are to be joined carries the dies and the tape at once. During an LTJ (low temperature joining process), a silicone cushion assures a sufficient hydrostatic pressure is applied to the substrate, dies and tape. However, residue from the tape remains on the substrate and dies after the joining process. This residue must be removed after the sinter process to ensure successful subsequent processing of the dies (e.g. bonding to the topside of the dies, etc.). In other joining processes, the dies are placed into a wet paste directly. However this approach results in characteristic marks in the sinter layer between the substrate and the dies which can degrade joint quality. Also, fluid in the wet paste tends to move toward the die edge which causes voids in the paste.

SUMMARY

The embodiments described herein eliminate the use of an adhesive tape for securing semiconductor die to a substrate during transport and die joining. Instead, a die alignment member is provided on the substrate for holding the die. The die alignment member is not glued to the substrate, and has openings for receiving dies which prevent displacement of the dies on the substrate during transport and die joining processes.

According to an embodiment of a die fixing method, the method includes providing a substrate having a metallized surface, forming a joining material on the metallized surface and placing a die alignment member with a plurality of openings on the substrate so that portions of the joining material are exposed through the openings. The method further includes placing a plurality of dies in the openings of the die alignment member with a bottom side of each die in contact with part of the joining material and attaching the plurality of dies to the metallized surface of the substrate at an elevated temperature and pressure with the die alignment member withstanding the elevated temperature and pressure. The die alignment member is removed from the substrate after the plurality of dies are attached.

According to an embodiment of a die fixing apparatus, the apparatus includes a work piece holder and a die alignment member. The work piece holder is configured to receive a substrate having a metallized surface and a joining material on the metallized surface. The die alignment member has a plurality of openings and is configured to be placed on the substrate so that portions of the joining material are exposed through the openings. The die alignment member is further configured to receive a plurality of dies in the openings of the die alignment member for attachment to the metallized surface of the substrate via the joining material.

According to another embodiment of a die fixing method, the method includes receiving by a work piece holder a substrate having a metallized surface and a joining material on the metallized surface and placing a non-adhesive die alignment member with a plurality of openings on the substrate so that portions of the joining material are exposed through the openings. The method further includes receiving a plurality of dies in the openings of the die alignment member for attachment to the metallized surface of the substrate via the joining material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
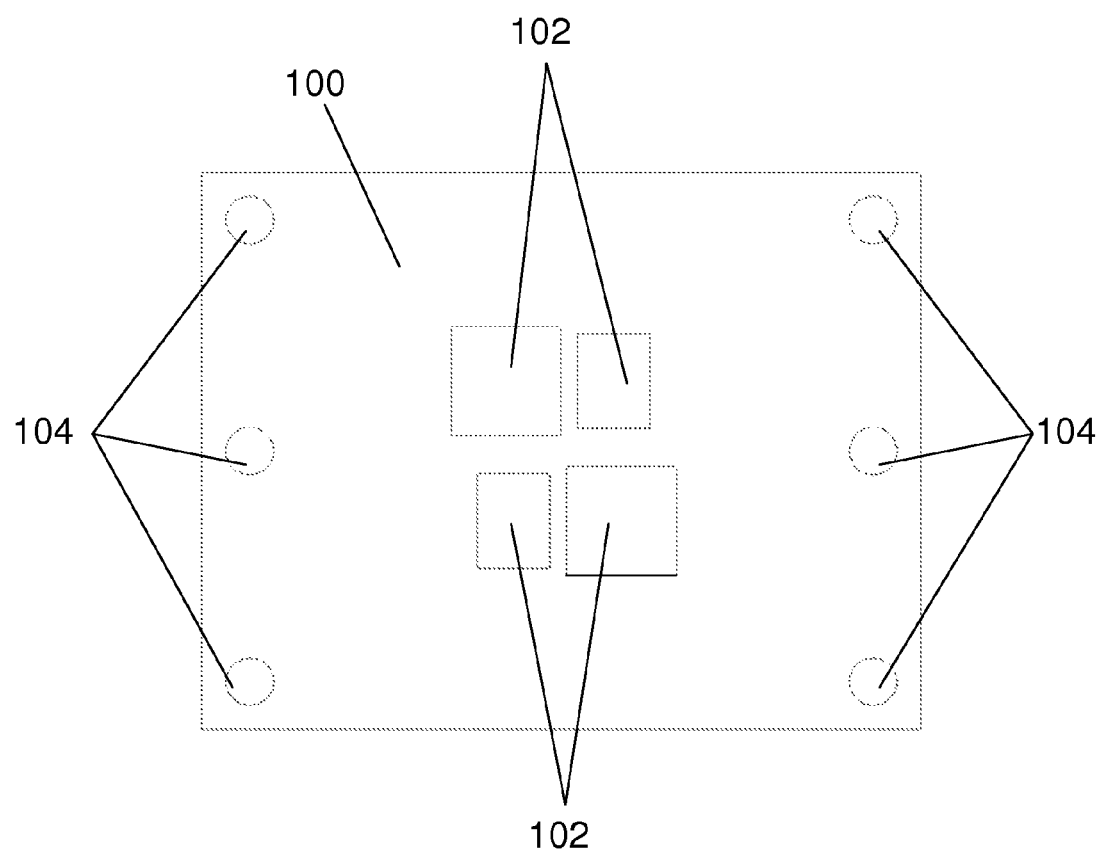
FIG. 1 illustrates a plan view of a die alignment member for securing semiconductor dies to a substrate during transport and die joining.

FIG. 1 illustrates an embodiment of a die alignment member 100 for use with a die fixing apparatus. The die alignment member 100 has a plurality of openings 102 and is configured to be placed on a substrate for receiving a plurality of dies in the openings 102 of the die alignment member 100. In one embodiment, the die alignment member 100 comprises polyimide. In another embodiment, the die alignment member 100 comprises polytetrafluoroethylene. The die alignment member 100 is non-adhesive and therefore not glued to the underlying substrate. The die alignment member 100 withstands the elevated temperature and pressure of the die joining process. In one embodiment, the die joining process is a sinter process.

Figure 2:
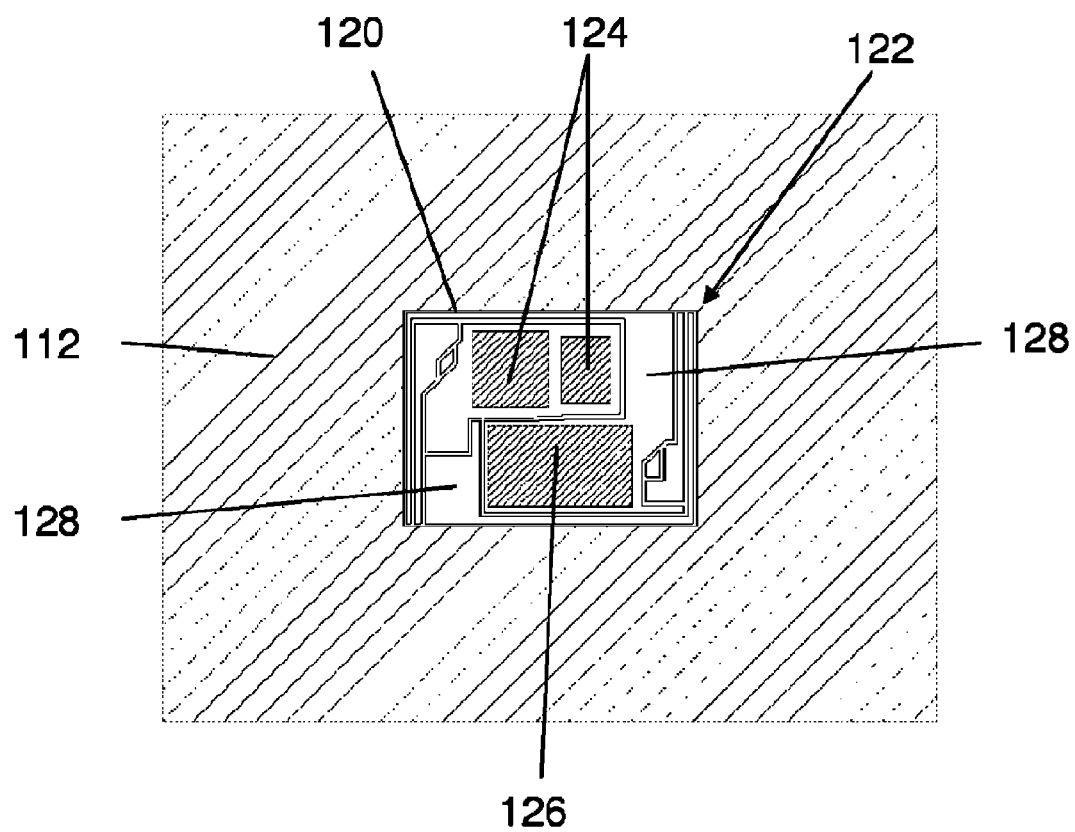
FIG. 2 illustrates a plan view of a substrate with a metallized surface and joining material on the metallized surface received by a work piece holder.

FIG. 2 illustrates an embodiment of a substrate 120 for use with the die alignment member 100. The substrate 120 is received by a work piece holder 112. The substrate 120 can be a direct copper bonded (DCB) substrate, a direct aluminum bonded (DAB) substrate or an active metal brazed (AMB) substrate. Alternatively, the substrate 120 can be an insulated metal substrate (IMS) or similar substrate which includes a metal baseplate (e.g. made of aluminum or copper) covered by a dielectric layer such as epoxy and a metal layer such as copper or aluminum on the dielectric layer. In each case, the substrate 120 has a metallized surface 122 and a joining material 124, 126 on the metallized surface 122. In one embodiment, the joining material 124, 126 is a printed paste. For example, a solder paste may be printed on the metallized surface 122 of the substrate 120 and pre-dried before the die alignment member 100 is placed on the substrate 120. In another embodiment, the joining material 124, 126 is a wet solder paste. The joining material 124, 126 can be patterned into a plurality of separate die sections 124 carrying one die or into a common joint area 126 for multiple dies as shown in FIG. 2. The joining material 124, 126 may also include patterned interconnect sections 128.

Figure 3:
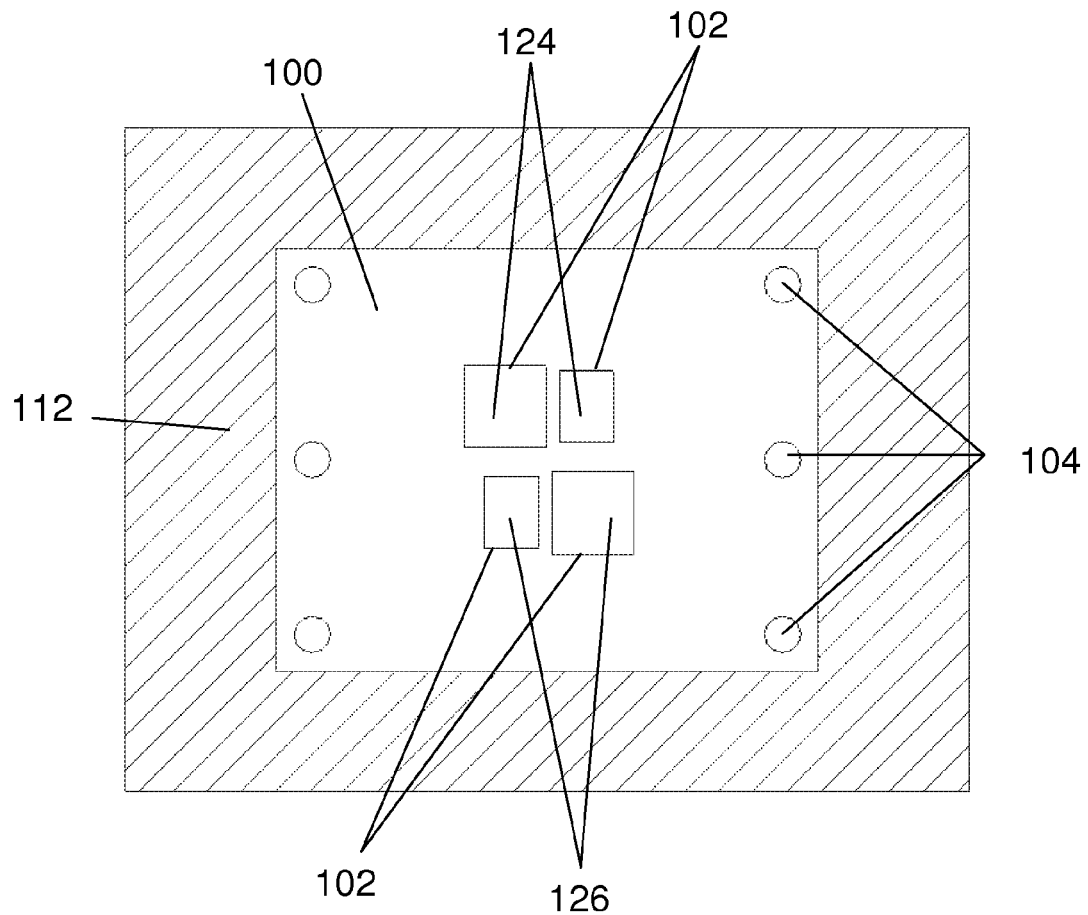
FIG. 3 illustrates a plan view of the work piece holder with the die alignment member placed on the substrate.

FIG. 3 shows the work piece holder 112 after the die alignment member 100 is placed on the substrate 120. At least part of the joining material 124, 126 is exposed though the openings 102 in the die alignment member 100. Parts of the common joint area can 126 be covered by the die alignment member 100 during the joining process for added protection.

Figure 4:
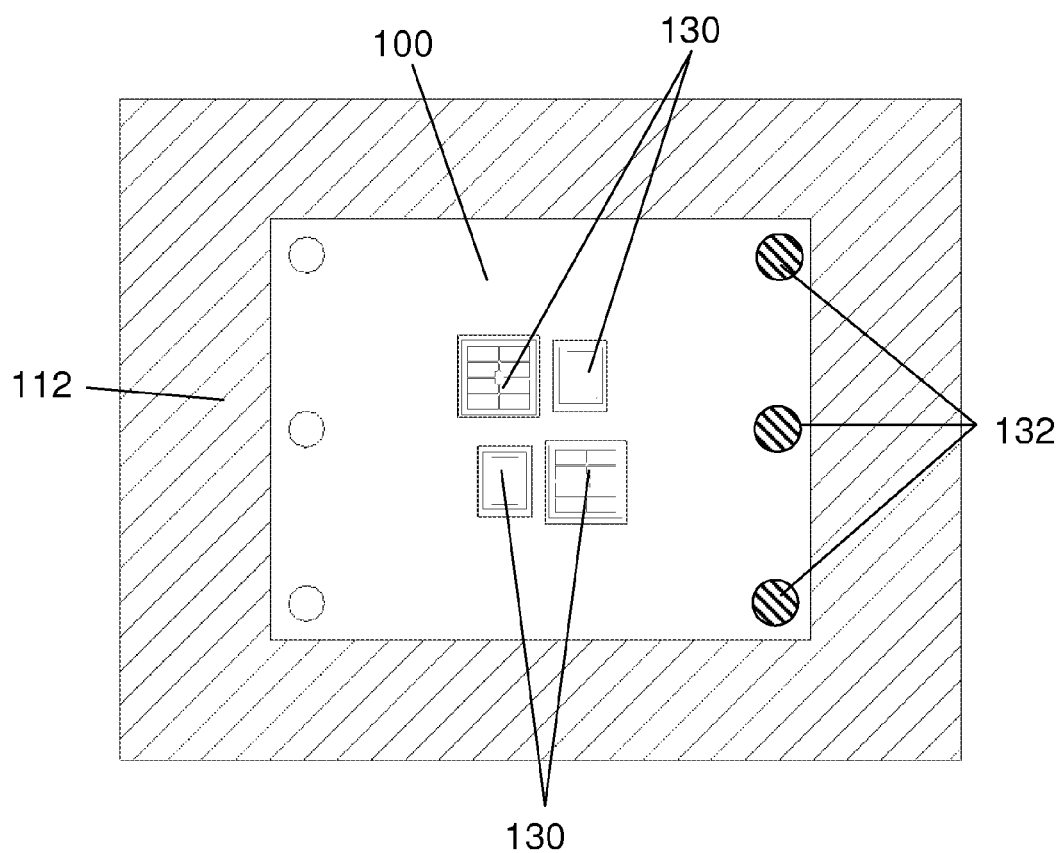
FIG. 4 illustrates a plan view of the substrate and die alignment member after a plurality of semiconductor dies are joined to the metallized surface of the substrate.

FIG. 4 shows a plurality of dies 130 placed in the openings 102 of the die alignment member 100, and subsequently attached to the metallized surface 122 of the substrate 120 via the joining material 124, 126. As such, each opening 102 in the die alignment member 100 is positioned over one of the die sections 124 or common joint area 126 of the joining material 124, 126 and the die alignment member 100 covers interconnect sections 130 of the joining material 124, 126 after placement on the substrate 120. The die alignment member 100 may have additional openings 104 disposed along the periphery of the die alignment member 100 as shown in FIG. 1 for receiving fasteners 132 for temporarily attaching the die alignment member 100 to the work piece holder 112 as shown in FIG. 4. The fasteners 132 can be bolts, screws, rivets, etc.

Figure 5:
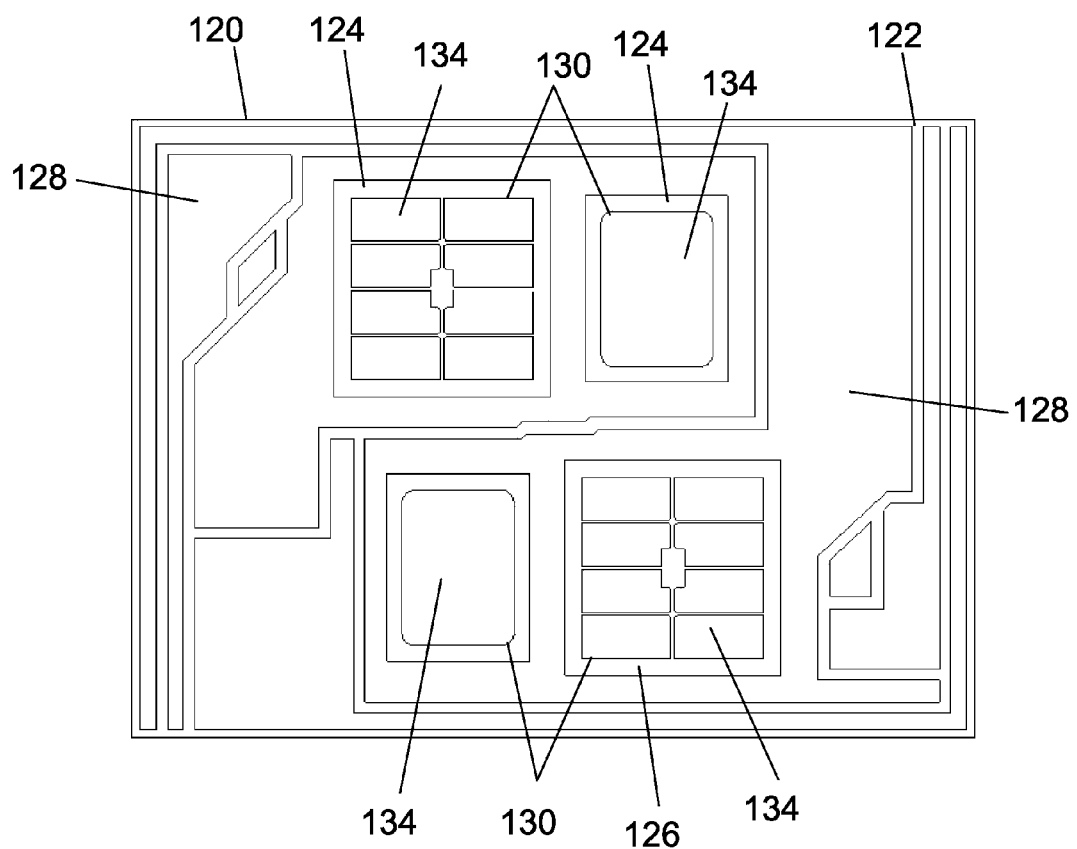
FIG. 5 illustrates a plan view of the substrate after the die joining process with the die alignment member removed from the substrate.

FIG. 5 shows the substrate 120 after the die joining process is complete and the die alignment member 100 is removed from the substrate 120. No tape residue is left behind on the exposed top side 134 of the dies 130 since the die alignment member 100 is non-adhesive and has openings 102 for receiving the dies 124 as described above.

The die fixing process according to one embodiment includes receiving the substrate 120 by the work piece holder 112 with the metallized surface 122 and joining material 124, 126 of the substrate 120 facing away from the work piece holder 112. The non-adhesive die alignment member 100 is then placed on the substrate 120 so that portions of the joining material 124, 126 are exposed through the openings 102 of the die alignment member 100. A plurality of dies 130 are received in the openings 102 of the die alignment member 100. With the dies 130 seated in the respective openings 102, the die alignment member 100 prevents displacement of the dies 130 during transport and joining processes. The dies 130 are attached to the metallized surface 122 of the substrate 110 via the joining material 124, 126 during a joining process such as a sinter process. In one embodiment, the die joining process is an LTJ process (low temperature joining process) where a cushion assures a sufficient hydrostatic pressure is applied to the substrate 120 and dies 130. The die alignment member 100 can be temporarily fastened to the work piece holder 112 before placement and attachment of the dies 130 as described above.

According to another die fixing method, a substrate 120 is provided with a metallized surface 122 and a joining material 124, 126 such as a wet solder paste or sintered paste formed on the metallized surface 122. The die alignment member 100 with the openings 102 is placed on the substrate 120 so that portions of the joining material 124, 126 are exposed through the openings 102 of the die alignment member 100. A plurality of dies 130 are placed in the openings 102 of the die alignment member 100 with a bottom side of each die 130 in contact with part of the joining material 124, 126. In one embodiment, the dies 130 are placed in the openings 102 of the die alignment member 100 using a tool such as a conventional pick-and-place tool so that a top side 134 of each die 130 facing away from the joining material 124, 126 is uncovered after placement by the tool. The joining material 124, 126 may be patterned into sections as described above and each die 130 is placed on an exposed section of the joining material 124, 126. The dies 130 are then joined to the metallized surface 122 of the substrate 120 at an elevated temperature and pressure. The die alignment member 100 withstands the elevated temperature and pressure of the joining process, and may conform to the surface contour of the substrate 120 during the joining process. The die alignment member 100 is removed from the substrate 120 after the dies 130 are attached to the metallized surface 122 of the substrate 120. At least one of the dies 130 can be a power semiconductor die such as an IGBT (insulated gate bipolar transistor) or power MOSFET (metal oxide semiconductor field effect transistor) and at least one other one of the dies 130 can be a diode. The die alignment member 100 can be reused if desired.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A die fixing method, comprising:
providing a substrate having a metallized surface;
forming a joining material on the metallized surface;
placing a die alignment member with a plurality of openings on the substrate so that portions of the joining material are exposed through the openings;
placing a plurality of dies in the openings of the die alignment member with a bottom side of each die in contact with part of the joining material, each of the openings of the die alignment member dimensioned to receive only one of the dies so that the alignment member prevents lateral displacement of the dies;
attaching the plurality of dies to the metallized surface of the substrate at an elevated temperature and pressure, the die alignment member withstanding the elevated temperature and pressure; and
removing the die alignment member from the substrate after the plurality of dies are attached to the metallized surface of the substrate.

2. A method according to claim 1, wherein the joining material is patterned into sections and each die is attached to a section of the joining material.

3. A method according to claim 1, wherein the joining material is patterned into a plurality of die sections and a plurality of interconnect sections, each die is attached to a die section of the joining material, and the die alignment member covers the interconnect sections of the joining material while the plurality of dies are attached to the metallized surface of the substrate.

4. A method according to claim 1, wherein the joining material is pre-dried prior to the die alignment member being placed on the substrate.

5. A method according to claim 1, wherein the substrate is one of a direct copper bonded substrate, a direct aluminum bonded substrate, an active metal brazed substrate or an insulated metal substrate.

6. A method according to claim 1, wherein the die alignment member comprises polyimide.

7. A method according to claim 1, wherein the die alignment member comprises polytetrafluoroethylene.

8. A method according to claim 1, further comprising fastening the die alignment member to the substrate before the placement and attachment of the plurality of die.

9. A method according to claim 1, wherein the plurality of dies are placed in the openings of the die alignment member using a tool so that a top side of each die facing away from the joining material is uncovered after placement by the tool.

10. A method according to claim 1, wherein the die alignment member conforms to a surface contour of the joining material under the elevated temperature and pressure.

11. A method according to claim 1, wherein at least one of the plurality of dies is an IGBT and at least one other one of the plurality of dies is a diode.

12. A die fixing method, comprising:
receiving by a work piece holder a substrate having a metallized surface and a joining material on the metallized surface;
placing a non-adhesive die alignment member with a plurality of openings on the substrate so that the die alignment member overlies portions of the joining material and portions of the joining material are exposed through the openings, each of the openings of the die alignment member dimensioned to receive only one of the dies so that the alignment member prevents lateral displacement of the dies; and
receiving a plurality of dies in the openings of the die alignment member for attachment to the metallized surface of the substrate via the joining material.

13. A method according to claim 12, further comprising temporarily fastening the die alignment member to the work piece holder prior to the plurality of dies being received in the openings of the die alignment member.

* * * * *